(12) United States Patent
Duce et al.

(10) Patent No.: US 10,661,710 B2
(45) Date of Patent: May 26, 2020

(54) EMBEDDED LIGHTING FEATURES FOR LIGHTING PANELS

(71) Applicant: The Boeing Company, Chicago, IL (US)

(72) Inventors: Jeff Duce, Chicago, IL (US); James Schalla, Chicago, IL (US); Ashley House, Chicago, IL (US); Jason Turner, Chicago, IL (US)

(73) Assignee: The Boeing Company, Chicago, IL (US)

( * ) Notice: Subject to any disclaimer, the term of this patent is extended or adjusted under 35 U.S.C. 154(b) by 58 days.

(21) Appl. No.: 16/149,540

(22) Filed: Oct. 2, 2018

(65) Prior Publication Data
US 2019/0031095 A1    Jan. 31, 2019

Related U.S. Application Data

(62) Division of application No. 14/940,241, filed on Nov. 13, 2015, now Pat. No. 10,118,547.

(51) Int. Cl.
*B60Q 3/74* (2017.01)
*F21S 43/00* (2018.01)
(Continued)

(52) U.S. Cl.
CPC .............. *B60Q 3/745* (2017.02); *B60Q 3/43* (2017.02); *B60Q 3/47* (2017.02); *B60Q 3/51* (2017.02);
(Continued)

(58) Field of Classification Search
CPC . B60Q 3/745; B60Q 3/43; B60Q 3/51; B60Q 3/47; H01L 33/62; H01L 33/483;
(Continued)

(56) References Cited

U.S. PATENT DOCUMENTS 7,857,484 B2 * 12/2010 Marshall .................. F21K 9/00
                                                        362/249.01
8,033,684 B2    10/2011 Marshall et al.
(Continued)

FOREIGN PATENT DOCUMENTS

DE        198 11 076         9/1999
EP        1 081 426          3/2001

OTHER PUBLICATIONS

European Search Report; Case Application No. EP19175199; Publication EP3547808A1; Batev, Petio (Year: 2019).*
(Continued)

*Primary Examiner* — Karabi Guharay
*Assistant Examiner* — Glenn D Zimmerman
(74) *Attorney, Agent, or Firm* — McDonnell Boehnen Hulbert & Berghoff LLP

(57) ABSTRACT

Lighting panels and methods of manufacturing lighting panels are described. An example lighting panel includes a substrate that has a planar surface, electrically conductive traces printed onto the planar surface of the substrate, and light sources mounted onto the electrically conductive traces at mounting positions such that the electrically conductive traces form an electrical interconnection between selected ones of the electrically conductive traces and associated ones of the light sources. The lighting panel also includes a polymer sheet provided over the light sources, and a composite base upon which a stack-up of the substrate with the printed electrically conductive traces, the light sources, and the polymer sheet is applied. The light sources are embedded into the composite base and are also flush with a top surface of the stack-up, and the substrate is also embedded into the composite base underneath the light sources at the mounting positions.

20 Claims, 3 Drawing Sheets

(51) Int. Cl.
*H05K 1/18* (2006.01)
*B60Q 3/47* (2017.01)
*B60Q 3/51* (2017.01)
*B60Q 3/43* (2017.01)
*B64D 47/02* (2006.01)
*H01L 33/48* (2010.01)
*H01L 33/62* (2010.01)
*H05K 1/02* (2006.01)
*H05K 3/12* (2006.01)
*H05K 3/14* (2006.01)
*H05K 3/28* (2006.01)

(52) U.S. Cl.
CPC .............. *B64D 47/02* (2013.01); *F21S 43/00* (2018.01); *H01L 33/483* (2013.01); *H01L 33/62* (2013.01); *H05K 1/189* (2013.01); *H01L 2224/18* (2013.01); *H01L 2933/0025* (2013.01); *H01L 2933/0066* (2013.01); *H05K 1/0274* (2013.01); *H05K 1/181* (2013.01); *H05K 3/125* (2013.01); *H05K 3/1216* (2013.01); *H05K 3/14* (2013.01); *H05K 3/284* (2013.01); *H05K 2201/091* (2013.01); *H05K 2201/10106* (2013.01); *H05K 2203/0278* (2013.01)

(58) Field of Classification Search
CPC ..... H01L 2933/0066; H01L 2933/0025; H01L 2224/18; H01L 2933/0033; H01L 51/5237; H01L 51/52; H01L 33/486; H01L 25/167; H01L 25/0753; H01L 25/048; B64D 47/02; F21S 43/00; H05K 1/189; H05K 2203/0278; H05K 2201/10106; H05K 2201/091; H05K 3/284; H05K 3/14; H05K 3/125; H05K 3/1216; H05K 1/181; H05K 1/0274
See application file for complete search history.

(56) References Cited

U.S. PATENT DOCUMENTS

| | | |
|---|---|---|
| 9,190,581 B2* | 11/2015 | Tischler ................ H01L 33/502 |
| 2004/0195576 A1 | 10/2004 | Watanabe et al. |
| 2005/0002197 A1 | 1/2005 | Kohlmeier-Beckmann et al. |
| 2005/0023974 A1 | 2/2005 | Chwang et al. |
| 2006/0290374 A1* | 12/2006 | Fisher .................... G09F 9/302 |
| | | 257/84 |
| 2008/0001160 A1 | 1/2008 | Andrews |
| 2009/0059609 A1 | 3/2009 | Marshall et al. |
| 2010/0187548 A1 | 7/2010 | Onushkin et al. |
| 2010/0308356 A1* | 12/2010 | Wirth .................... H01L 33/507 |
| | | 257/98 |
| 2011/0024783 A1 | 2/2011 | Horng et al. |
| 2011/0266587 A1 | 11/2011 | Naruse et al. |
| 2013/0026504 A1* | 1/2013 | Marx ........................ F21K 9/00 |
| | | 257/88 |
| 2013/0161637 A1 | 6/2013 | Werkhoven et al. |
| 2014/0319560 A1 | 10/2014 | Tischler |
| 2015/0041845 A1 | 2/2015 | Schwarz et al. |
| 2015/0079709 A1* | 3/2015 | Tischler ................ H01L 33/502 |
| | | 438/27 |
| 2015/0155441 A1 | 6/2015 | Klexeev et al. |
| 2016/0031368 A1 | 2/2016 | Staudigel et al. |
| 2017/0136944 A1 | 5/2017 | Duce et al. |

OTHER PUBLICATIONS

Extended European Search Report prepared by European Patent Office in application umber EP 16197570 dated Mar. 17, 2017.

* cited by examiner

EMBEDDED LIGHTING FEATURES FOR LIGHTING PANELS

CROSS REFERENCE TO RELATED APPLICATION

The present disclosure claims priority to and is a divisional of Ser. No. 14/940,241, filed on Nov. 13, 2015, the entire disclosure of which is herein incorporated by reference.

FIELD

The present disclosure generally relates to interior lighting panels for passenger aircraft, and more particularly, to aircraft ceiling, stow bin, valences, sidewalls or other mounted lighting panels adapted to display a starry nighttime sky effect.

BACKGROUND

Passenger aircraft that operate over long distances during the night typically include interior lighting arrangements that provide substantially reduced ambient light so that passengers can sleep comfortably, but which is still bright enough to enable those passengers who choose not to sleep to move about the cabin safely. For example, some models of passenger jets incorporate ceiling panels that incorporate light emitting diodes (LEDs) arranged so as to blink in random patterns against a gray or dark blue background, and which, in a reduced ambient light condition, gives the relaxing, soporific appearance of a starry nighttime sky, and hence, is referred to as a "Starry Sky" ceiling lighting arrangement.

A conventional Starry Sky lighting panel may include complex discrete wiring and electrical components located on a back surface thereof. The panel may use lenses, lens holders, hardwired LEDs, and wire bundles deployed on individual standoffs, and discrete power conditioning and control components that are integrated in a relatively complicated manufacturing process to produce a panel that gives the desired effect. In a typical installation, the aircraft may contain many of such panels, each of which may contain many LEDs. A typical Starry Skies ceiling panel feature requires the LEDs to be manually installed in the panel.

The disadvantages and limitations of these solutions are that the method of producing the panel is costly and relatively heavy, requires intensive, ergonomically costly manual labor steps due to the amount of manually installed wire, takes up a relatively large volume behind the ceiling panels and is difficult to retrofit into existing aircraft. Because of the mass and volume of the wires for this system, it is typically limited to only be installed in ceilings.

In light of the foregoing, there is a need in the relevant industry for an aircraft ceiling lighting panel that provides a Starry Sky effect through a "solid state" method that does not use lenses, lens holders, wired LEDs and complex associated point-to-point wiring, reduces panel weight, volume, manual fabrication and assembly labor and cost, eliminates repetitive injuries, and which can easily be retrofitted into existing aircraft.

SUMMARY

In one example, a lighting panel is described comprising a substrate having a planar surface, a plurality of electrically conductive traces printed onto the planar surface of the substrate, and a plurality of light sources mounted onto the plurality of electrically conductive traces on the planar surface of the substrate at mounting positions such that the plurality of electrically conductive traces form an electrical interconnection between selected ones of the plurality of electrically conductive traces and associated ones of the plurality of light sources. The lighting panel includes a polymer sheet provided over the plurality of light sources, and a composite base upon which a stack-up of the substrate with the printed plurality of electrically conductive traces, the plurality of light sources mounted on the planar surface, and the polymer sheet is applied. The plurality of light sources are embedded into the composite base and are also flush with a top surface of the stack-up, and the substrate is also embedded into the composite base underneath the plurality of light sources at the mounting positions.

In another example, a method of manufacturing a lighting panel is described. The method comprises printing a plurality of electrically conductive traces onto a planar surface of a substrate, mounting a plurality of light sources onto the plurality of electrically conductive traces on the planar surface of the substrate at mounting positions such that the plurality of electrically conductive traces form an electrical interconnection between selected ones of the plurality of electrically conductive traces and associated ones of the plurality of light sources, providing a polymer sheet over the plurality of light sources, and providing a stack-up of the substrate with the printed plurality of electrically conductive traces, the plurality of light sources mounted on the planar surface, and the polymer sheet onto a composite base. The method also includes applying pressure and heat to the stack-up and the composite base to embed the plurality of light sources into the composite base so as to be flush with a top surface of the stack-up, and to embed the substrate into the composite base underneath the plurality of light sources at the mounting positions.

The features, functions, and advantages that have been discussed can be achieved independently in various embodiments or may be combined in yet other embodiments further details of which can be seen with reference to the following description and drawings.

BRIEF DESCRIPTION OF THE FIGURES

The novel features believed characteristic of the illustrative embodiments are set forth in the appended claims. The illustrative embodiments, however, as well as a preferred mode of use, further objectives and descriptions thereof, will best be understood by reference to the following detailed description of an illustrative embodiment of the present disclosure when read in conjunction with the accompanying drawings, wherein:

DETAILED DESCRIPTION

Figure 1:
FIG. 1 illustrates a portion of an example process for manufacturing a lighting panel, in which a substrate is shown that has a planar surface, according to an example embodiment.

Disclosed embodiments will now be described more fully hereinafter with reference to the accompanying drawings, in which some, but not all of the disclosed embodiments are shown. Indeed, several different embodiments may be described and should not be construed as limited to the embodiments set forth herein. Rather, these embodiments are described so that this disclosure will be thorough and complete and will fully convey the scope of the disclosure to those skilled in the art.

Within examples, a lighting panel and a method of manufacturing a lighting panel are described. The lighting panel comprises a substrate having a planar surface, a plurality of electrically conductive traces printed onto the planar surface of the substrate, and a plurality of light sources mounted onto the plurality of electrically conductive traces on the planar surface of the substrate at mounting positions such that the plurality of electrically conductive traces form an electrical interconnection between selected ones of the plurality of electrically conductive traces and associated ones of the plurality of light sources. A polymer sheet can be provided over the plurality of light sources. A composite base is provided upon which a stack-up of the substrate with the printed plurality of electrically conductive traces, the plurality of light sources mounted on the planar surface, and the polymer sheet is applied. The plurality of light sources are embedded into the composite base and are also flush with a top surface of the stack-up, and the substrate is also embedded into the composite base underneath the plurality of light sources at the mounting positions.

Example lighting panels described integrate light sources into crush core panels to create a lighting effect that may be used for interior panels of aircraft, for example. Example methods for manufacturing described herein may use a plastic film with printed traces and bonded light sources that are then integrated into a panel via a method of crush core processing with composites. A decorative layer can then be applied over the light sources. This process can be used to integrate a lighting feature similar to Starry Skies into any crush core aircraft panels (e.g., ceilings, stow bins, valences, sidewalls, etc.).

Thus, in some examples, the disclosure relates to "Starry Sky" aircraft ceiling panel lighting systems and methods for manufacturing them. The lighting panels comprise a plurality of small light sources, such as micro-miniature light emitting diodes (LEDs), or alternatively, organic light emitting diodes (OLEDs), and together with control circuitry connected with conductive traces that are printed or otherwise formed onto an aircraft structural ceiling panel and/or to a lamination of flexible substrates that are then bonded to such a structural ceiling panel in the form of an appliqué therefor. The result is a Starry Sky lighting panel construction that is lighter, smaller, less expensive, and easier to retrofit to existing aircraft than existing Starry Sky lighting panel systems.

Referring now to FIGS. 1-6, an example process is shown for manufacturing a lighting panel, according to an example embodiment. In FIG. 1, a substrate 200 is shown that has a planar surface 202. The planer surface 202 provides a relatively smooth surface or substantially flat surface.

As used herein, by the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide. Similarly, the term "about" includes aspects of the recited characteristic, parameter, or value allowing for deviations or variations, including for example, tolerances, measurement error, measurement accuracy limitations and other factors known to skill in the art, and also ranges of the parameters extending a reasonable amount to provide for such variations.

The substrate 200 may comprise a polymer film, or a polyvinyl fluoride (PVF) material, such as Tedlar film (Du Pont Tedlar polyvinyl fluoride (PVF)), for example. Other flexible, dielectric substrate materials may also be used for the substrate 200, such as, for example, Kapton, Mylar or polyvinyl chloride (PVC) materials.

Figure 7:
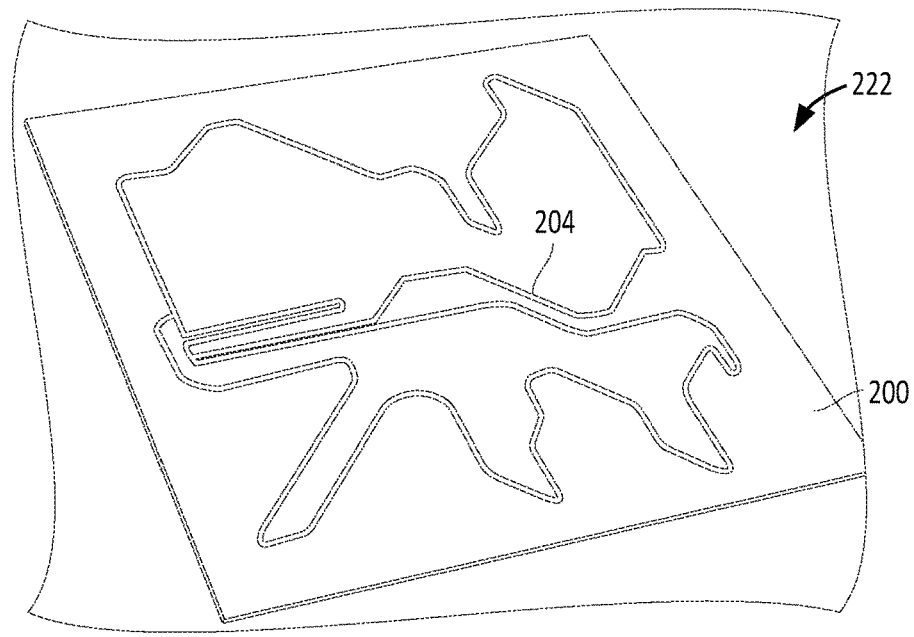
FIG. 7 illustrates a top view of the substrate with electrically conductive traces, according to an example embodiment.

A plurality of electrically conductive traces 204 are printed onto the planar surface 202 of the substrate 200. Electrically conductive traces 204 are shown in FIG. 7. The electrically conductive traces 204 can be written on the planar surface 202 of the substrate 200 so as to make electrical connections with respective leads of electrical components (i.e., anode and cathode of LEDs).

One or more of several conductive trace writing methods may be used to print the electrically conductive traces 204 on the substrate 200. In one example, plasma spraying may be used to deposit a wide range of conductive or non-conductive materials directly onto conformal surfaces. In another example, aerosol spraying can also be used to deposit a wide range of materials with extremely fine (e.g., 4-5 micron) feature size, either on flat substrates or on conformal surfaces. In still another example, ink jet printing technology can also be used to print to flat substrates, which may then be adhered to conformal surfaces. And finally, as another example, screen printing of conductive inks may be used to print to polymer film which is then adhered to a conformal surface. Any combination of such techniques may also be used. Printed electronics allows the use of flexible substrates, which lowers production costs and allows fabrication of mechanically flexible circuits.

Figure 2:
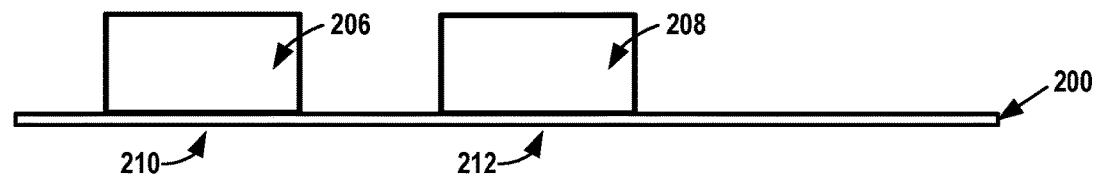
FIG. 2 illustrates another portion of the example process for manufacturing a lighting panel, in which a plurality of light sources are mounted onto the plurality of electrically conductive traces on the planar surface of the substrate at mounting positions, according to an example embodiment.
Figure 8:
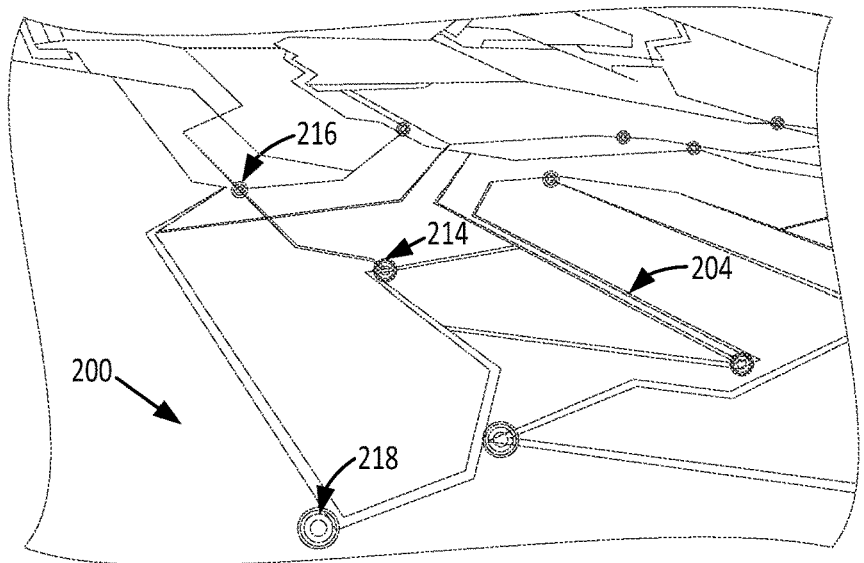
FIG. 8 illustrates the substrate with a circuit including light sources, according to an example embodiment.

As shown in FIG. 2, a plurality of light sources 206 and 208 are mounted onto the plurality of electrically conductive traces 204 on the planar surface 202 of the substrate 200 at mounting positions 210 and 212 such that the plurality of electrically conductive traces 204 form an electrical interconnection between selected ones of the plurality of electrically conductive traces and associated ones of the plurality of light sources. The electrically conductive traces 204 may comprise groups of circuits, and the light sources 206 and 208 are mounted onto the electrically conductive traces 204 so as to form the groups of circuits. As an example, FIG. 8 illustrates the substrate with a circuit including light sources 214, 216, and 218. Multiple circuits may be included based on interconnection of various light sources.

The electrically conductive traces interconnect the light sources 206 and 208 with power and control circuitry such that each light source 206 and 208 can be controlled independently of the other, and can be caused to blink or "twinkle." Alternatively, groups of associated light source in the panel can be controlled independently of each other.

The light sources 206 and 208 may include light emitting diodes (LEDs), organic light emitting diodes (OLEDs), other surface mounted devices (SMDs), or a combination of each. The light sources 206 and 208 may be mounted using a conductive adhesive, and the resulting substrate-light source assembly may be cured, e.g., by UV radiation, if UV curing adhesives are used, or alternatively, may be cured with heat, for example, in an autoclave process.

Figure 3:
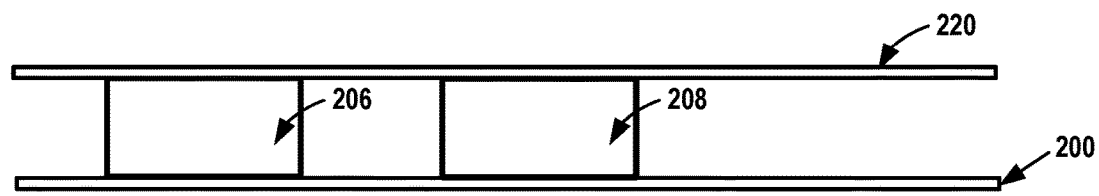
FIG. 3 illustrates another portion of the example process for manufacturing a lighting panel, in which a polymer sheet is provided over the light sources, according to an example embodiment.

As shown in FIG. 3, a polymer sheet 220 is provided over the light sources 206 and 208. The polymer sheet 220 can be a clear polymer sheet, and laid over the light sources 206 and 208 for attachment through a final process (described below).

Figure 4:
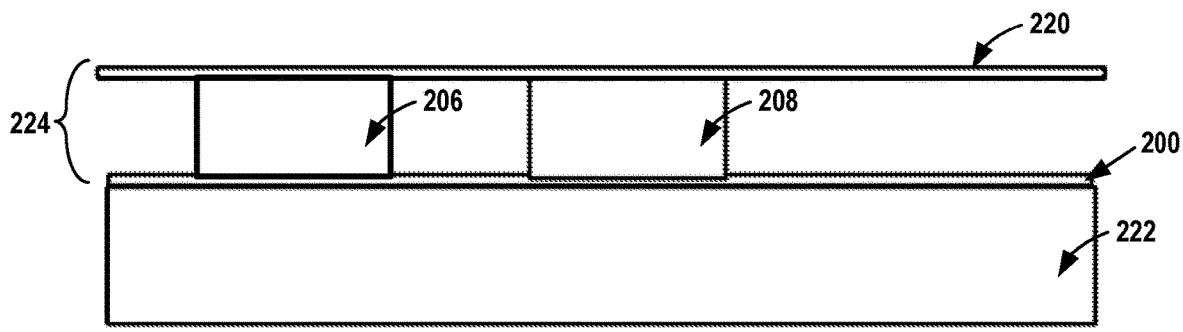
FIG. 4 illustrates another portion of the example process for manufacturing a lighting panel, in which a composite base is provided upon which a stack-up of the substrate with the printed plurality of electrically conductive traces, the light sources mounted on the planar surface, and the polymer sheet is applied, according to an example embodiment.

As shown in FIG. 4, a composite base 222 is provided upon which a stack-up 224 of the substrate 200 with the printed plurality of electrically conductive traces 204, the light sources 206 and 208 mounted on the planar surface 202, and the polymer sheet 220 is applied. The composite base 222 may comprise an existing aircraft structural ceiling panel, made of, e.g., a polycarbonate or polyurethane plastic. As another example, the composite base 222 may comprise a honeycomb core panel. The composite base 222 may include any composite material, such as a lightweight material like an uncured pre-impregnated reinforcing tape or fabric (i.e., "prepreg"). The tape or fabric can include a plurality of fibers such as graphite fibers that are embedded within a matrix material, such as a polymer, e.g., an epoxy or phenolic. The tape or fabric could be unidirectional or woven depending on a degree of reinforcement desired.

Figure 5:
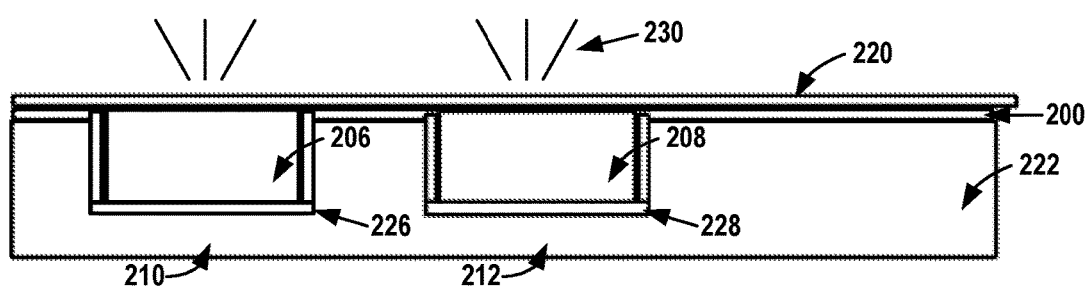
FIG. 5 illustrates another portion of the example process for manufacturing a lighting panel, in which the light sources are embedded into the composite base and are also flush with a top surface of the stack-up, and the substrate is also embedded into the composite base underneath the light sources at the mounting positions, according to an example embodiment.

As shown in FIG. 5, using a crush-core process, the light sources 206 and 208 are embedded into the composite base 222 and are also flush with a top surface of the stack-up 224, and the substrate 200 is also embedded into the composite base 222 underneath the light sources 206 and 208 at the mounting positions 210 and 212. For example, portions 226 and 228 of the substrate 200 are embedded into the composite base 222 underneath the light sources 206 and 208 at the mounting positions 210 and 212.

The crush core process includes placing the composite base 222 with the stack-up 224 in a large press, and the stack-up 224 is crushed down into the composite base 222 to a predetermined thickness. Example pressures up to 300 psi/20.7 bar cause honeycomb cell walls of the composite base 222 to fold over and flatten, creating more bonding surface area for the stack-up 224. This method creates panels of consistent thickness, ensuring good fit and finish during installation. Thus, using the crush core process, the stack-up 224 is bonded into the composite base 222 using pressure and heat to cure the bond.

As shown in FIG. 5, the polymer sheet 220 covers the light sources 206 and 208. The light sources 206 and 208 are in contact with the polymer sheet 220 and are operated to shine light 230 through the polymer sheet 220. No holes are provided in the polymer sheet 220 that expose the light sources 206 and 208. In addition, no pockets or potting of the composite base 222 are required for insertion of the light sources 206 and 208. Rather, the crush core process embeds the light sources 206 and 208 into the composite base 222 with corresponding portions 226 and 228 of the substrate 200 embedded underneath the light sources 206 and 208 to provide electrical connections. Without the need for pre-drilled holes or pre-formed pockets, additional manufacturing steps can be removed. The ability to integrate the light sources 206 and 208 into the composite base 222 without requiring a pocket or potting of the light sources 206 and 208, or other apertures or lenses enables the panel to be manufactured more efficiently.

Figure 6:
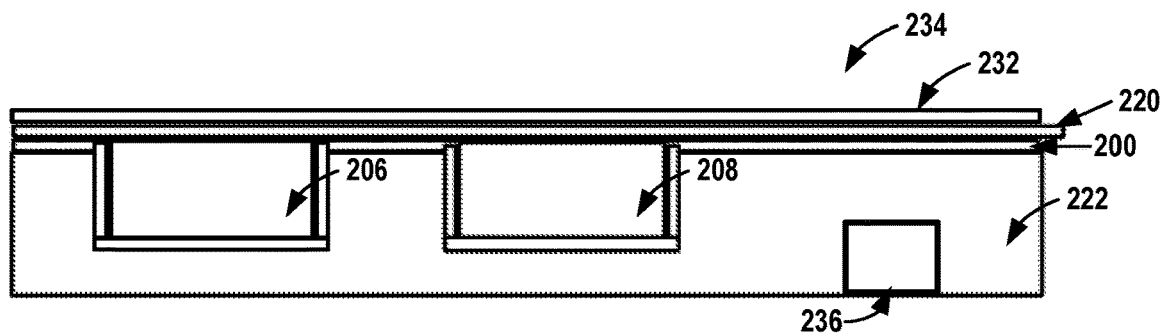
FIG. 6 illustrates another portion of the example process for manufacturing a lighting panel, in which a decorative film can also be applied over the polymer sheet to cover the light sources, according to an example embodiment.

As shown in FIG. 6, a decorative film can also be applied over the polymer sheet 220 to cover the light sources 206 and 208. In this example, the decorative film 232 may be a clear or decorative laminate ("declams") comprising a thin, flexible film, such as Du Pont Tedlar polyvinyl fluoride (PVF). The decorative film 232 also does not require any small apertures, or vias through which the light sources 206 and 208 are respectively exposed. The decorative film 232 can be bonded to the polymer sheet 220 using an adhesive. FIG. 6 illustrates a completed lighting panel 234. In other examples, the decorative film 232 may be replaced with a layer painted on for decoration.

Figure 9:
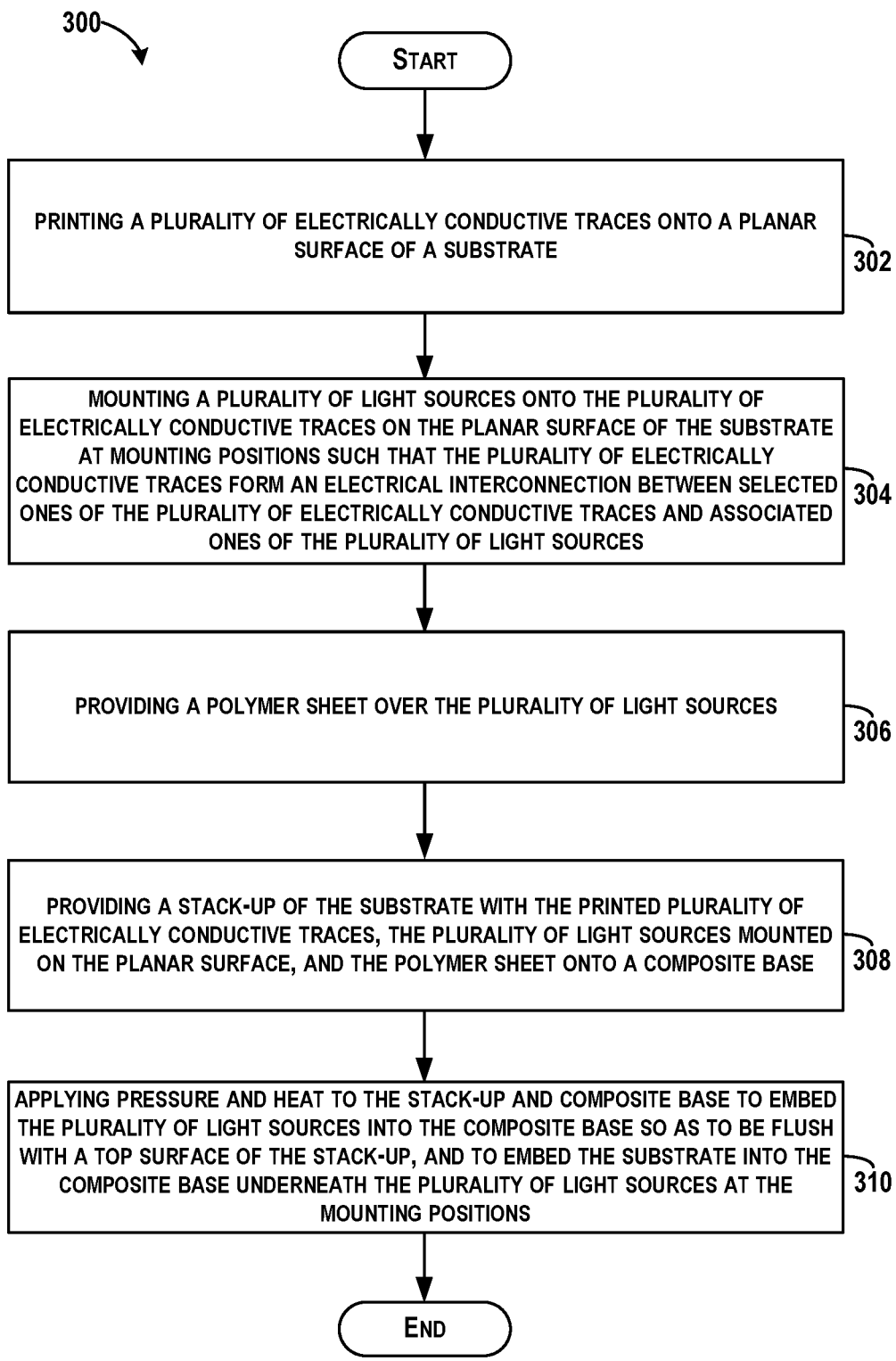
FIG. 9 shows a flowchart of an example method for manufacturing a lighting panel, according to an example embodiment.

FIG. 9 shows a flowchart of an example method 300 for manufacturing a lighting panel, according to an example embodiment. Method 300 shown in FIG. 9 presents an embodiment of a method that, for example, could be used within the processes shown in FIGS. 1-6, for example. Method 300 may include one or more operations, functions, or actions as illustrated by one or more of blocks 302-310. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

It should be understood that for this and other processes and methods disclosed herein, flowcharts show functionality and operation of one possible implementation of present embodiments. Alternative implementations are included within the scope of the example embodiments of the present disclosure in which functions may be executed out of order from that shown or discussed, including substantially concurrent or in reverse order, depending on the functionality involved, as would be understood by those reasonably skilled in the art.

At block 302, the method 300 includes printing the plurality of electrically conductive traces 204 onto the planar surface 202 of the substrate 200. As an example, the electrically conductive traces 204 may be screen printed as silver ink on a Tedlar substrate or other polyvinyl fluoride (PVF) material. The electrically conductive traces 204 may be printed to provide connections to electrical components (or to terminals of electrical components), so that the electrical components can be placed randomly across the substrate 200.

At block 304, the method 300 includes mounting the plurality of light sources 206 and 208 onto the plurality of electrically conductive traces 204 on the planar surface 202 of the substrate 200 at mounting positions 210 and 212 such that the plurality of electrically conductive traces 204 form an electrical interconnection between selected ones of the plurality of electrically conductive traces and associated ones of the plurality of light sources. The light sources 206 and 208 may be mounted using a conductive epoxy. The electrically conductive traces 204 may be printed to result in groups of circuits, and the light sources 206 and 208 are mounted onto the electrically conductive traces 204 so as to form the groups of circuits. The electrically conductive traces 204 may be printed so as to result in four groups of circuits that are independent and not wired in parallel, for example.

At block 306, the method 300 includes providing the polymer sheet 220 over the plurality of light sources 206 and 208. The polymer sheet 220 protects the electrically conductive traces 204 and the light sources 206 and 208 from sweep/sand and paint processes applied to a final product of the lighting panel. The polymer sheet 220 can be a clear polymer sheet, and covers the light sources 206 and 208 so that the light sources 206 and 208 are in contact with the polymer sheet 220 and shine light through the polymer sheet 220.

At block 308, the method 300 includes providing the stack-up 224 of the substrate 200 with the printed plurality of electrically conductive traces 204, the plurality of light sources 206 and 208 mounted on the planar surface 202, and the polymer sheet 220 onto the composite base 222. The composite base 222 may include a honeycomb core panel.

At block 310, the method 300 includes applying pressure and heat to the stack-up 224 and the composite base 222 to embed the plurality of light sources 206 and 208 into the composite base 222 so as to be flush with a top surface of the stack-up 224, and to embed the substrate 200 into the composite base 222 underneath the plurality of light sources 206 and 208 at the mounting positions 210 and 212. Pressure and heat may be applied using a crush core process. When the materials are removed from the press, the light sources 206 and 208 are flush with the top surface and embedded into the composite base 222.

The ability to integrate the light sources 206 and 208 into the composite base 222 without requiring pockets or predrilled holes formed for the light sources 206 and 208, and no need for potting of the light sources 206 and 208 allows for integration of the substrate 200 and light sources 206 and 208 into the composite base 222 in a manner to reduce weight, size, and cost of prior systems. Further, with no pockets created, then additional encapsulation with a potting material is also avoided. The light sources 206 and 208 can be crushed directly into the composite base 222 which allows for integration without use of a pocket and potting material and has been shown to provide a better surface finish.

In addition, the light sources 206 and 208 are bright enough to not need a hole to be cut in any top layer or coating which further simplifies the design. Thus, there is no need for holes or lenses or other structures to project light through the polymer sheet 220 since the light sources 206 and 208 directly contact the polymer sheet 220.

A decorative film 232, or paint, may then be applied to a top surface of the polymer sheet 220, which enables painting by protecting the electronics. Connectors can then be installed for power and operation of the lighting panel.

As those of skill in the art will also appreciate, there are numerous other fabrication and assembly options available that will arrive at the same or a substantially similar lighting panel 234 configuration.

The lighting panel 234 may include a power and control module insert 236 for supplying electrical power and control signals to the light sources 206 and 208 of the lighting panel 234. This enables the printed electrically conductive traces 204 to be connected to wiring. Still further, other discrete electrical components, e.g., microprocessors and RF control or transceiver components to power and control the light sources 206 and 208, can be embedded into the power and control module insert 236. The power and control module insert 236 may further incorporate terminal input/output connection pads that enable easy electrical interconnection between the power and control module insert 236 and the light sources 206 and 208 via the electrically conductive traces 204.

As those of skill in the art will appreciate, many aircraft systems can provide electrical power and control signals to light fixtures or the lighting panel 234. Electronics located within the light panel 234, such as within the power and control module insert 236, can control color and brightness of emitted light. Pulse width modulation can be used to control brightness of each of the light sources 206 and 208 within the lighting panel 234. Furthermore, an aircraft ceiling may include many lighting panels, and each lighting panel may be individually controlled.

Control over the lighting panel 234 (typically involving overall star field brightness and blink rate) may be effected, for example, by transmitting control commands or settings from the aircraft to the lighting panel 234 via a wireless link and received at the power and control module insert 236. In one example, the power and control module insert 236 includes a radio receiver that receives such commands or settings. An antenna for the radio may be printed directly on the substrate 200 or on a substrate laminated thereto, along with other electrical conductors and components.

In another example, control of the lighting panel 234 may be effected by transmitting control commands or settings from the airplane to the panel via communication over power line (COPL) technology. Electronics of the aircraft superimpose control/setting signals over a power signal to the lighting panel 234. A COPL transceiver located in the power and control module insert 236 interprets these signals and controls the light sources 206 and 208 accordingly.

The lighting panel 234 offers a number of advantages over prior lighting panels. Components of the lighting panel 234 are less expensive (excluding investment in capital equipment). The current manufacturing process has high ergonomic cost factors, including fine detail, repetitive motions and the like which are substantially eliminated in the examples disclosed herein.

Additionally, integration of direct write electronics and the electrically conductive traces 204 into the lighting panel 234 has several additional benefits, including reduced panel weight, shorter process flow times, improved durability, a more efficient form factor and improved ergonomics of manufacture. In the past, some aircraft customers have not selected the Starry Sky lighting option because of the weight penalty associated therewith. The lighting panel 234 can provide a weight savings per panel, which, in an aircraft equipped with numerous such panels, results in an appreciable weight savings over prior panels.

Further, as described above, in some examples the lighting panel 234 may have a wired supply of electrical power and a wireless, e.g., radio, interface for communication and control. Thus, the lighting panel 234 requires a low voltage electrical interface for power, and power can be tapped from existing sources, such as ceiling wash lights that are typically turned down to low power while the starry sky effect is operating. Tapping power from local sources and providing wireless control simplifies retrofit of existing aircraft by reducing the need to run additional aircraft wiring.

While various examples of the lighting panel disclosed herein are described and illustrated in the context of aircraft interior ceiling lighting systems, it will be evident that they are not limited to this particular application, but may be used in a variety of other applications, e.g., other aircraft surfaces, such as entry area ceilings, destination spaces, or even in non-aerospace applications, such as dance halls theaters residential ceilings, advertisements, and the like.

The description of the different advantageous arrangements has been presented for purposes of illustration and description, and is not intended to be exhaustive or limited to the embodiments in the form disclosed. Many modifications and variations will be apparent to those of ordinary skill in the art. Further, different advantageous embodiments may describe different advantages as compared to other advantageous embodiments. The embodiment or embodiments selected are chosen and described in order to explain the principles of the embodiments, the practical application, and to enable others of ordinary skill in the art to understand the disclosure for various embodiments with various modifications as are suited to the particular use contemplated.

What is claimed is:

1. A method of manufacturing a lighting panel, comprising:
   printing a plurality of electrically conductive traces onto a planar surface of a substrate;
   mounting a plurality of light sources onto the plurality of electrically conductive traces on the planar surface of the substrate at mounting positions such that the plurality of electrically conductive traces form an electrical interconnection between selected ones of the plurality of electrically conductive traces and associated ones of the plurality of light sources;
   providing a polymer sheet over the plurality of light sources;
   providing a stack-up of the substrate with the printed plurality of electrically conductive traces, the plurality of light sources mounted on the planar surface, and the polymer sheet onto a composite base; and
   applying pressure and heat to the stack-up and the composite base to embed the plurality of light sources into the composite base so as to be flush with a top surface of the stack-up, and to embed the substrate into the composite base underneath the plurality of light sources at the mounting positions.

2. The method of claim 1, wherein mounting the plurality of light sources onto the plurality of electrically conductive traces on the planar surface of the substrate at mounting positions comprises using conductive epoxy to mount the plurality of light sources.

3. The method of claim 1, wherein the substrate comprises a polyvinyl fluoride (PVF) material.

4. The method of claim 1, wherein the plurality of electrically conductive traces comprise groups of circuits, and wherein the plurality of light sources are mounted onto the plurality of electrically conductive traces so as to form the groups of circuits.

5. The method of claim 1, wherein the plurality of light sources comprise light emitting diodes (LEDs), organic light emitting diodes (OLEDs), or a combination of each.

6. The method of claim 1, wherein the polymer sheet is a clear polymer sheet.

7. The method of claim 1, wherein providing the polymer sheet over the plurality of light sources comprises covering the plurality of light sources.

8. The method of claim 1, further comprising applying a decorative film over the polymer sheet.

9. The method of claim 1, wherein the composite base comprises a honeycomb core panel.

10. The method of claim 1, wherein applying pressure and heat comprises using a crush core process.

11. The method of claim 1, wherein applying pressure and heat further comprises:
    embedding the plurality of light sources into the composite base without requiring pockets or pre-drilled holes formed for the plurality of light sources.

12. The method of claim 1, wherein the lighting panel comprises an aircraft structural ceiling panel.

13. The method of claim 1, wherein providing the polymer sheet over the plurality of light sources comprises providing the polymer sheet such that the plurality of light sources are in contact with the polymer sheet and shine light through the polymer sheet, wherein the polymer sheet is a single piece construction.

14. The method of claim 1, wherein providing the polymer sheet over the plurality of light sources comprises providing the polymer sheet such that the plurality of light sources are in direct contact with the polymer sheet and shine light through the polymer sheet.

15. The method of claim 1, further comprising:
    providing a power and control module insert for supplying electrical power and control signals to the plurality of light sources.

16. The method of claim 1, further comprising:
    providing transceiver components to control the plurality of light sources.

17. The method of claim 1, wherein printing the plurality of electrically conductive traces onto the planar surface of the substrate comprises printing the plurality of electrically conductive traces onto a planar surface of a polymer film.

18. The method of claim 1, wherein printing the plurality of electrically conductive traces onto the planar surface of the substrate comprises printing silver ink on the substrate.

19. The method of claim 1, wherein applying pressure and heat further comprises:
    embedding the substrate with the plurality of electrically conductive traces into the composite base with the plurality of electrically conductive traces underneath the plurality of light sources at the mounting positions.

20. The method of claim 7, wherein the plurality of light sources are in contact with the polymer sheet and shine light through the polymer sheet.

* * * * *